United States Patent
Funfrock et al.

(10) Patent No.: US 7,102,362 B2
(45) Date of Patent: Sep. 5, 2006

(54) INTEGRATED CIRCUIT FOR TESTING CIRCUIT COMPONENTS OF A SEMICONDUCTOR CHIP

(75) Inventors: Fabien Funfrock, München (DE); Michael Bernhard Sommer, Raubling (DE)

(73) Assignee: Infineon Technologies, AG, Munich (DE)

( * ) Notice: Subject to any disclaimer, the term of this patent is extended or adjusted under 35 U.S.C. 154(b) by 8 days.

(21) Appl. No.: 10/920,204

(22) Filed: Aug. 18, 2004

(65) Prior Publication Data
US 2005/0040830 A1 Feb. 24, 2005

(30) Foreign Application Priority Data
Aug. 19, 2003 (DE) ................ 103 38 030

(51) Int. Cl.
G01R 27/06 (2006.01)
G01R 31/3185 (2006.01)
G11C 29/04 (2006.01)

(52) U.S. Cl. .............. 324/610; 324/763; 714/718
(58) Field of Classification Search ............... 324/763, 324/765, 638, 610
See application file for complete search history.

(56) References Cited
U.S. PATENT DOCUMENTS

| | | | | |
|---|---|---|---|---|
| 5,844,921 A * | 12/1998 | Bou-Ghazale et al. | ...... | 714/724 |
| 6,081,479 A * | 6/2000 | Ji et al. | ....................... | 365/233 |
| 6,346,820 B1 * | 2/2002 | Yamagami | ................... | 324/763 |
| 6,639,393 B1 * | 10/2003 | Tasker et al. | ............. | 324/76.19 |
| 6,639,397 B1 * | 10/2003 | Roth et al. | ................ | 324/158.1 |
| 6,670,802 B1 * | 12/2003 | Dietrich et al. | ........... | 324/158.1 |
| 2003/0053471 A1 * | 3/2003 | Stief | ........................... | 370/412 |
| 2003/0201787 A1 * | 10/2003 | Manning | .................... | 324/763 |
| 2005/0024075 A1 * | 2/2005 | Srivastava | ................... | 324/763 |
| 2005/0099199 A1 * | 5/2005 | Sugita et al. | ................ | 324/765 |
| 2005/0194980 A1 * | 9/2005 | Konig et al. | ................. | 324/610 |

* cited by examiner

*Primary Examiner*—Anjan Deb
(74) *Attorney, Agent, or Firm*—Edell, Shapiro & Finnan LLC

(57) ABSTRACT

An integrated circuit includes a first circuit component, a second circuit component, and an external terminal for making contact with the circuit. The first circuit component is connected to the external terminal via the second component. A bridging circuit connects the first circuit component to the external terminal and can be activated by a test mode signal. In the active state, the bridging circuit connects the external terminal to the first circuit component while bridging the second circuit component, while it is nonconducting in the deactivated state. Circuit components integrated in the semiconductor chip can be electrically measured nondestructively via activatable switches. Circuit components that lie between the external terminal and the device to be measured can be excluded from the measurement by bridging circuits. The method also makes it possible to measure a plurality of integrated devices in parallel or serially.

11 Claims, 2 Drawing Sheets

INTEGRATED CIRCUIT FOR TESTING CIRCUIT COMPONENTS OF A SEMICONDUCTOR CHIP

CROSS REFERENCE TO RELATED APPLICATIONS

This application claims priority under 35 USC §119 to German Application No. DE 10338030.2, filed on Aug. 19, 2003, and titled "Integrated Control for Testing of Control Components of a Semiconductor Chip," the entire contents of which are hereby incorporated by reference.

FIELD OF THE INVENTION

The invention relates to an integrated circuit for testing circuit components of a circuit that is integrated in a semiconductor chip.

BACKGROUND

During and after the fabrication of integrated circuits in semiconductor chips such as, e.g., DRAM memory chips, these are generally subject to a functional test. This is intended to ensure that only defect-free and functional devices are supplied. In this case, a distinction is made between two types of tests, product data measurements and parameter data measurements.

Product data measurements are carried out on the finished end product. In this case, a number of different input signals are applied to the circuit integrated in the chip, which result in specific output signals. The combination of input signals are selected such that the tests do not take an excessively long time, but as many functional errors as possible are covered. Thus, in the course of product data measurement, the chip is checked in its entirety with regard to its correct functioning.

By contrast, parameter data measurements are intended to reflect as well as possible the electrical properties of the circuit components integrated in the semiconductor chip. These measurements take place during the process of fabricating the semiconductor chip. In the course of fabricating semiconductor chips, the latter are arranged on a semiconductor wafer. The kerf separates the individual chips from one another.

Test structures are provided in the kerf for the parameter data measurement. The test structures are intended to simulate the behavior of the devices that are integrated in the chip. The test structures of the kerf are externally accessible via contacts. In the course of parameter measurement, important characteristic quantities that are intended to provide information about correct or defective functioning of the devices in the chip are measured at the test structures. Typical characteristic quantities are, e.g., in the case of a memory chip, the threshold voltages of the selection transistors or the magnitude of the capacitance of the memory cell. If a drift of characteristic quantities is ascertained during the fabrication process it is possible to intervene in the production process, and to perform an adjustment of the devices by modifying relevant process variables.

In the further production steps, the semiconductor chips on the wafer are separated by being sawn apart along the kerf, i.e., dicing. In this case, the kerf is lost, and with it the test structures situated therein. This has the disadvantage that, in the event of the defect analysis of semiconductor chips that is generally carried out in the event of customer returns, it is often not possible to ascertain the exact cause of error. Thus, e.g., aging effects that result in the failure of the chips cannot be detected since the test structures at which the parameter data were measured during the production process are no longer available for a renewed measurement. A before/afterward comparison is not possible.

Furthermore, the problem arises that the actual behavior of the devices in the chip can never be determined by measuring parameter data in the kerf. Thus, it is not possible to detect effects due to mutual influencing on account of the small spatial distances between the circuit components in the chip (proximity), crosstalk, etc. Previous tests and defect analysis methods lead to delays in product introduction and difficult qualifications.

An integrated circuit and a method for testing integrated circuits of a semiconductor chip, which allow the functional checking and defect analysis to be configured effectively by nondestructively measuring characteristic electrical parameters of circuit components that are integrated in the semiconductor chip, is desirable.

SUMMARY

An integrated circuit includes a first circuit component, a second circuit component, and a terminal for externally making contact with the circuit. The first component is connected to the external terminal via the second component. The integrated circuit has a bridging circuit by which the first circuit component can be connected to the external terminal. The bridging circuit can be activated by a test mode signal. In the deactivated state, the bridging circuit is nonconducting. However, if it is activated by the test mode signal, then the external terminal is connected to the first component with the second component being bridged.

This enables internal devices of the circuit integrated in the semiconductor chip to be directly accessed externally for measurement purposes, specific circuit components which, in the normal operating state of the circuit, are situated on the path between the external terminal and the integrated device to be measured being excluded from the measurement. The invention is that only the device of interest is included in the measurement. The interfering influence of circuit components, which, in the normal operating state, are situated on the path between external terminal and device to be measured on the measurement result, is avoided through the activation of bridging circuits. The bridging circuit must therefore be designed such that it leaves approximately uninfluenced a measurement result of the device that is to be measured. For this purpose, the bridging circuit is designed with the least possible impedance. In particular, the bridging circuit has a low inductance per unit area.

The integrated circuit can include a plurality of external terminals, and a first circuit component to be measured. The first circuit component has a plurality of terminals and, in each case, connects one of the terminals of the first circuit component to a different external terminal via a bridging circuit. This arrangement makes it possible, for example, to measure the current/voltage relationship of a device.

The external terminal can be activated by a test mode signal by further terminals via a selection circuit. The external terminal is either connected to a first line connected to a third circuit component, or is connected to a second line connected to a bridging circuit. In this case, the selection circuit is controlled by the test mode signal such that a connection between the external terminal and the first line is produced in test operation of the integrated circuit of the semiconductor chip and a connection of the external terminal to a second line is realized in normal operation. In use of such a circuit arrangement, the same terminal contact is used both for the normal operating state and for the test operating state of the integrated circuit. Therefore, additional contacts that are used for test purposes are not needed.

The integrated circuit can be used as part of a memory. The memory includes a memory cell array, data lines for reading from the memory cell array, a first switch, which connects the data line to the bridging circuit, and a second switch for connecting data lines of the first hierarchical stage to the data lines of the second hierarchical stage. The data lines are organized in a plurality of hierarchical stages.

This arrangement makes it possible to connect the external terminal to one or a plurality of memory cells of a memory cell array via the first switch and the second switch. As a result, a first circuit component, which includes one or a plurality of memory cells, is accessible via the external terminal contact and can be measured electrically. The bridging circuit additionally eliminates the interfering influence of a second circuit component situated on the connecting path between the external terminal and the first circuit component.

A plurality of memory cell arrays can be connected to a common line via the first switch and, in turn, to the external terminal via the common line. As a result, a first circuit component, which includes one or a plurality of memory cell arrays, is accessible via the external terminal and can be measured. The bridging circuit additionally eliminates the interfering influence of a second circuit component situated on the connecting path between the external terminal and the first circuit component.

The second circuit component is generally an amplifier circuit, for example, a read/write amplifier. The influence of the second circuit component on the measurement of the first circuit component is intended to be prevented.

A method for test operation of a semiconductor chip can makes it possible to measure electrical properties of circuit components of an integrated circuit can be operated in a normal operation and in a test operation. The integrated circuit includes an activatable bridging circuit. In order to measure the electrical properties of one of the circuit components of the integrated circuit, it is operated in the test operation. In normal operation of the integrated circuit, an external terminal is connected to a second circuit component via a first circuit component. The bridging circuit is deactivated in this state. In test operation of the integrated circuit, a test mode signal is applied to the bridging circuit. As a result, the bridging circuit is activated for bridging the first circuit component in test operation of the integrated circuit. The external terminal is connected to the second circuit component by the bridging circuit in test operation of the integrated circuit.

In this case, a connection between an external terminal of the circuit that is integrated in the semiconductor chip and an internal circuit component of the integrated circuit is produced via lines interconnected via switches, and at least one bridging circuit by which internal circuit components can be bridged.

According to a further feature of the method, a short-circuit current is fed into the integrated circuit by applying an input voltage having an AC component to the external terminal.

Further, in a method for measuring electrical properties of circuit components of the integrated circuit, by applying an input pulse of the input voltage to the external terminal, a wave running into the integrated circuit is generated and a reflected wave is subsequently detected at the external terminal.

The changeover of the semiconductor chip on the normal operating state to the test state is, for example, effected by application of different test modes to the switches.

Each test mode causes switches to open or close. Since the switches connect lines in each case, it is possible to vary the line length between the external terminal and the circuit component to be measured depending on the test mode signal. It is thereby possible to include different numbers of circuit components of the integrated circuit in the measurement.

The choice of suitable different test modes which activate switches enables one device or else a plurality of devices of a memory cell array to be connected serially or in parallel, one or a plurality of memory cell arrays to be connected serially or in parallel or else one or a plurality of line segments to be connected via the switches to the external terminal, or enables electrical measurement thereof in a further step.

The electrical measurement of the device is, for example, effected by an input pulse being fed onto the line via the external terminal after the application of a test mode and thus the production of a connection between the external terminal and the device to be measured. The scattering parameters that are generally customary in radio frequency measurement technology can then be measured by measuring waves moving to and for from the external terminal to the internal device. From the scattering parameters, it is then possible to deduce characteristic quantities such as, in the case of a memory chip, for example, the magnitude of the input capacitance of the memory transistor or the threshold voltages of the selection transistors. For high-frequency measurements, in particular, the transmission of an input signal from the external terminal contact of the circuit to the circuit component to be measured is intended to be effected as far as possible without reflections.

With the instant method, the devices that occur in the integrated circuit of a semiconductor chip are measured. Therefore, the measurement no longer exhibits any uncertainties with regard to proximity effects which were previously undetectable when measuring devices in the kerf.

The instant method operates nondestructively and therefore, the measurement of electrical quantities of interest appertaining to integrated circuit components can be repeated, i.e, if a defect analysis has to be carried out in the event of customer returns. A comparison of the data measured when the defect-free product was supplied with the parameter data measured anew on the defective product makes it possible to detect the failure of the circuit on account of a degradation of specific circuit components. For example, aging effects of specific circuit components can then also be demonstrated by means of this type of defect analysis.

BRIEF DESCRIPTION OF THE DRAWINGS

An exemplary embodiment of the invention is explained in more detail below with reference to FIGS. 1 to 3, in which.

DETAILED DESCRIPTION

Figure 1:
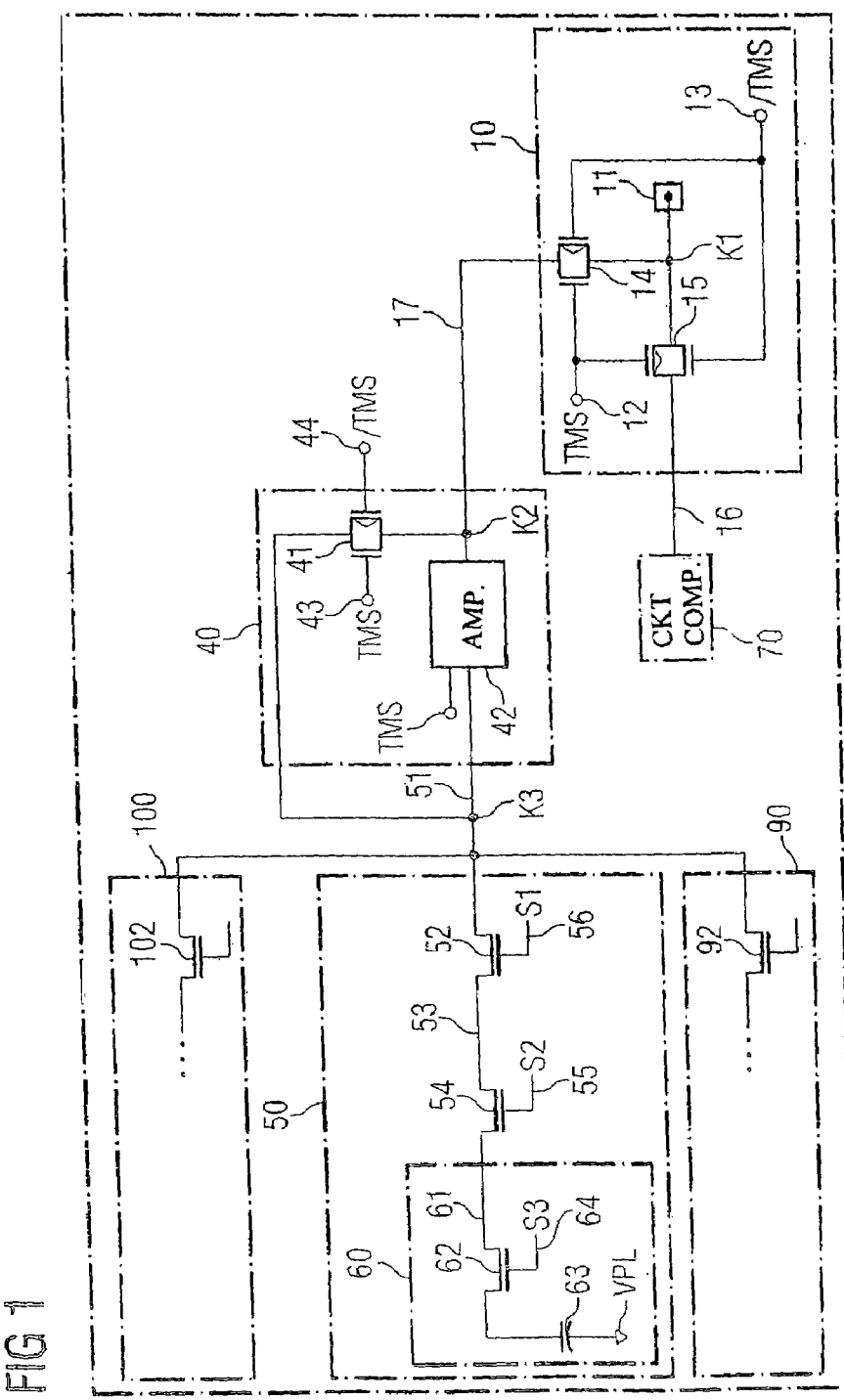
FIG. 1 shows by way of example an integrated circuit for testing circuit components of a semiconductor memory chip.

FIG. 1 shows a semiconductor memory chip 1 in a simplified manner. The semiconductor memory chip includes an input circuit 10, a functional circuit 40, a memory cell array 50 with a memory cell 60, and further memory cell arrays 90 and 100.

The input circuit 10 has three terminals 11, 12 and 13. The input circuit also includes switches 14 and 15, which are designed as CMOS transfer gates, for example. During operation of the circuit arrangement, the transfer gates 14 and 15 produce connections either to the line 16 connected to a circuit component 70 in the case of normal operation, or to a data line 17 required for test operation. The external terminal 11 serves for feeding a test signal into the integrated circuit of the semiconductor memory chip. The test mode circuit TMS and the inverse test mode signal /TMS are applied to the terminals 12 and 13.

The functional circuit 40 includes functional units of a semiconductor memory chip that are situated between the input and output terminals and the memory cell array. These are generally input and output buffers, decoders and read/write amplifiers. For reasons of clarity, FIG. 1 illustrates only one read/write amplifier 42 as an example of these elements. The read/write amplifier 42 is connected to the memory cell array 50 via a line 51. The read/write amplifier 42 amplifies the signals of the memory cell array and forwards the signals to the line 17. Furthermore, a CMOS transfer gate 41 is situated within the functional circuit 40 and, in the activated state, bridges the read/write amplifier 42 and thus produces a direct connection between the line 17 and the line 51.

The memory cell array 50 is illustrated in a simplified manner in FIG. 1 and includes, for example, a DRAM memory cell 60 and also a switching transistor 52 and a switching transistor 54. The switching transistor 52, which is switched into the conducting state by the signal S1 at its gate input 56, connects the line 51 to the line 53. The switching transistor 54, which is switched into the conducting state by the signal S2 at its gate input 55, connects the line 61 of the memory cell 60 to the line 53. The memory cell 60 is designed as a dynamic single-transistor memory cell and includes the selection transistor 62, which is controlled with the signal S3 via the gate input 64, and the storage capacitance 63 connected to a reference potential VPL.

The functioning of the circuit arrangement is illustrated below.

A line leads from the terminal 11 to a node K1, where it divides into two lines. One line leads to a transfer gate 14 and the other line leads to a transfer gate 15. The transfer gates are, for instance, designed as CMOS transfer gates including an N-MOS and P-MOS transistor connected in parallel and can be switched into the conducting or locking state through driving with a test mode signal TMS. For example, a test mode signal TMS is applied to the gate of the N-MOS transistor and an inverse test mode signal /TMS with respect thereto is applied to the P-MOS transistor of a CMOS transfer gate, or vice versa. In the arrangement illustrated in FIG. 1, the N-MOS gate input of the transfer transistor 14 is connected to the P-MOS gate input of the transfer transistor 15. The P-MOS gate input of the transfer transistor 14 is connected to the N-MOS gate input of the transfer transistor 15.

If a test mode signal TMS is applied to the N-MOS transfer transistor of the transfer gate 14 and the inverse test mode signal /TMS is applied to the P-MOS transfer transistor of the transfer gate 14, then the transfer device 14 is switched into the conducting state and a conducting connection arises between the external terminal contact 11 and the line 17. The transfer gate 15 is inhibited in this case since the test mode signal TMS is also present, via the common line, at the P-MOS gate input of the transfer gate 15 and the inverse test mode signal /TMS is present at the N-MOS gate input of the transfer transistor 15. By choice of the test mode signal TMS or the inverse test mode signal /TMS with respect thereto, the transfer gate 15 is switched into the conducting state and the transfer gate 14 is inhibited. In this case, the external terminal 11 is connected to the line 16 via the transfer gate 15. This configuration is generally chosen if the memory chip is to be operated in the normal operating state.

In the test operating state, the outwardly leading terminal contact 11 is connected to the line 17 via the transfer gate 14. It may be connected via a node K2 to a read/write amplifier 42 connected to the line 51, or may be directly connected to the line 51 via a transfer gate 41, which is, for instance, designed as a CMOS transfer gate. The two N-MOS and P-MOS transistors of the transfer gate 41 can be driven with test mode signals TMS and inverse test mode signals /TMS with respect thereto via the terminals 43, 44. If the transfer gate 41 is switched into the conducting state, then a connection between the node K2 and the node K3 arises via the activated transfer gate 41, which connection has lower impedance than the connection between K2 and K3 via the read/write amplifier 42. The amplifier 42 can thereby be bridged with low impedance.

The node K3 is connected to the line 51. The memory cell arrays 50 are connected thereto via a transfer transistor 52. The transfer transistor 52 is preferably designed as an N-MOS transistor. The bit lines 61 of the individual memory cells 60 are connected to the line 53 via an N-MOS transistor 54. For simplification, FIG. 1 illustrates only one memory cell 60 that is connected to the line 53 via the transfer transistor 54. A plurality of memory cell arrays 50, not included in FIG. 1 for reasons of simplification, are connected to the line 51 via the line 53 and the transfer transistor 52. For simplification, FIG. 1 illustrates only one line 53 that is connected to the line 51 via the switch 52.

The gate inputs 56, 55 and 64 of the transistors 52, 54 and 62 may be switched by signals S1, S2, S3 such that a connection may be produced between the storage capacitance 63 of a memory cell 60 and the external terminal 11. The magnitude of the capacitance 63 may, for example, be measured via this line.

Figure 3:
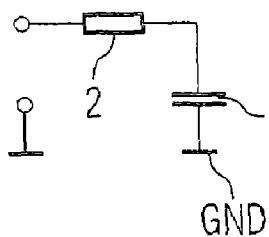
FIG. 3 shows the equivalent circuit diagram of a memory cell connected to an external terminal via a line.

FIG. 3 shows the basic measurements set up. The resistance 2 includes the line resistance and the drain/source bulk resistances of the transfer gates, which are situated along the lines between the terminal contact 11 and the storage capacitance 63. The capacitance 3 includes the line capacitances and the actual storage capacitance of the memory cell 60. The equivalent circuit exhibits high-pass filter behavior. As seen proceeding from the terminal contact 11 into the circuit, the bridging circuit thus acts as a high-pass filter in the activated state. For example, a test voltage includes a DC component of 0.1 V and a superposed AC voltage with an amplitude of +/−0.1 V is applied to the terminal 11, then a short-circuit current flows into the circuit arrangement. The larger the storage capacitance 3, the more pronounced the high-pass filter behavior of the RC element becomes and the larger the short-circuit current. The magnitude of the storage capacitance 3 can be determined by measuring the short-circuit current flowing into the circuit arrangement. Equally, the phase shift between voltage and current permits conclusions to be drawn about the magnitude of the resistance 2 and the capacitance 3 of the equivalent circuit diagram.

Scattering parameter measurements are also conceivable in addition to measuring the magnitude of the short-circuit current or the phase relationship between current and voltage. With this type of measurement, an input pulse is fed in at the terminal 11. The wave that precedes into the integrated circuit and the reflected wave are then measured, from which equivalent parameters of the integrated devices of the semiconductor memory chip can be calculated.

Figure 2:
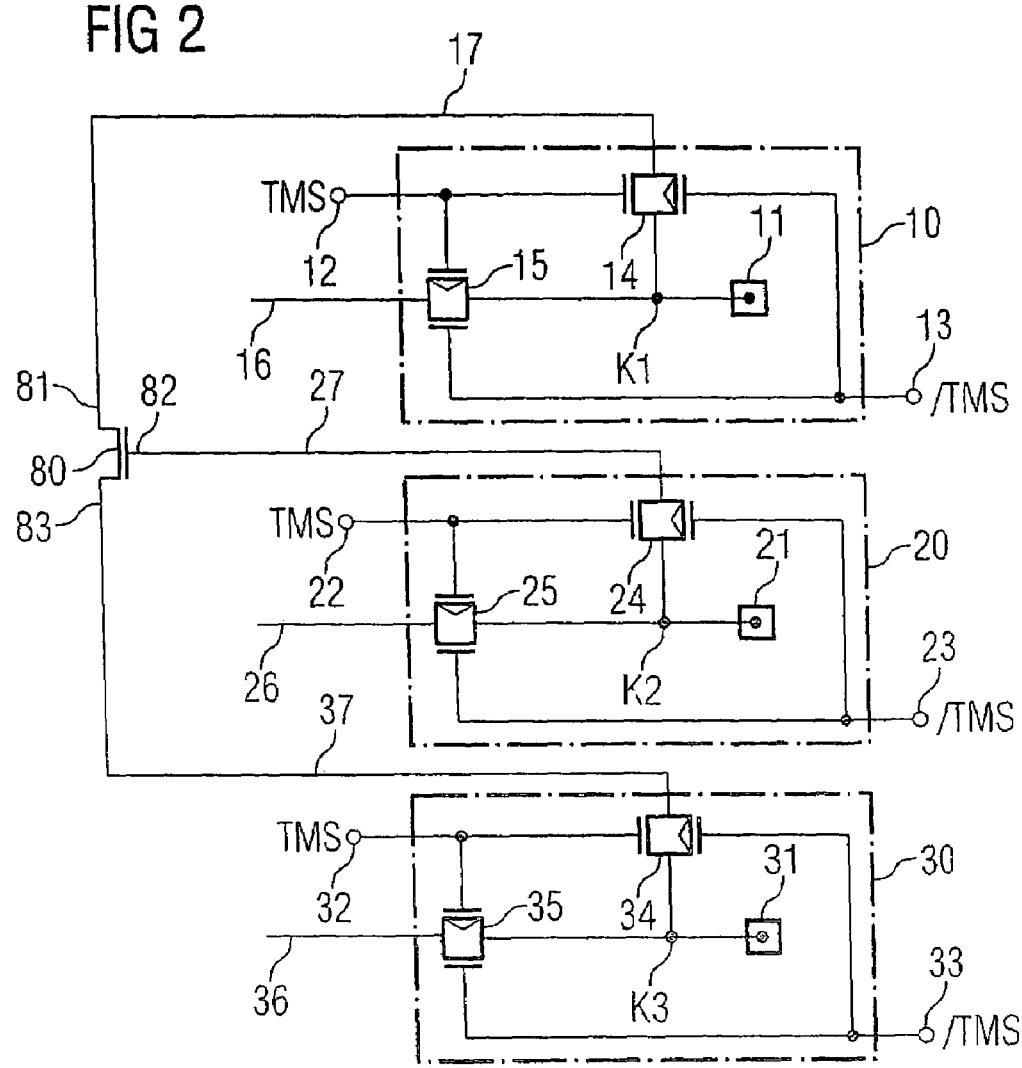
FIG. 2 shows by way of example a circuit component of an integrated circuit whose terminals are connected in each case to an external terminal via a line and switches.

FIG. 2 shows, for example, an arrangement for testing a circuit component 80 of the integrated circuit of a semiconductor chip. For example, a transistor 80 has the drain terminal 81, and the gate terminal 82 and the source terminal 83 are tested in this circuit arrangement. The transistor 80 is an integrated device of the semiconductor chip. The circuit arrangement 10 has already been described in connection with FIG. 1. Therefore, its description and also the description of the circuit arrangements 20 and 30 that are identical thereto are dispensed with here. By applying a suitable test mode signal TMS and the inverse test mode signal /TMS to the transistors of the input circuits 10, 20 and 30, it is possible to produce a conducting connection between the terminal 11 and the drain terminal 81, a further connection between the gate terminal 82 and the terminal 21 and a further connection between the source terminal 83 and the contact 31. This measuring arrangement makes it possible, for example, to record the families of characteristic curves of the transistor 80.

A number of implementations have been described. Nevertheless, it will be understood that various modifications may be made without departing from the spirit and scope. Accordingly, other implementations are within the scope of the following claims.

We claim:

1. An integrated circuit, comprising:
   a first circuit component;
   a second circuit component;
   an external terminal for making contact with the integrated circuit, wherein the first circuit component is connected to the external terminal via the second circuit component; and
   a bridging circuit activated by a test mode signal;
   wherein the bridging circuit is connected in parallel with the second circuit component such that the external terminal is connected to the first circuit component via the bridging circuit with a lower impedance than via the second circuit component, the bridging circuit being conducting in the activated state, and nonconducting in the deactivated state; and
   wherein the external terminal connects, via a selection circuit controlled by the test mode signal, to either a first line connected to a third circuit component or a second line connected to the bridging circuit.

2. The integrated circuit as claimed in claim 1, further comprising:
   a plurality of external terminals, wherein the first circuit component has a plurality of terminals, and the bridging circuit connects one of the terminals of the first circuit component to a different external terminal.

3. The integrated circuit as claimed in claim 1, wherein the integrated circuit is part of a memory, the memory comprising:
   a memory cell array,
   a plurality of data lines for reading from the memory cell array, the data lines being organized in a plurality of hierarchical stages,
   a first switch which connects the data lines of a second hierarchical stage to the bridging circuit, and
   a second switch for connecting data lines of a first hierarchical stage to the data lines of the second hierarchical stage.

4. The integrated circuit as claimed in claim 3, wherein a plurality of memory cells are connected to the data line via the second switch and the first switch is connected to the second switch via one of the data lines.

5. The integrated circuit as claimed in claim 3, wherein a plurality of memory cell arrays are connected to a common line via switches.

6. The integrated circuit as claimed in claim 3, wherein the second circuit component is a read/write amplifier.

7. A method for measuring electrical properties of circuit components of an integrated circuit, comprising:
   providing an integrated circuit that is operated in a normal operation and in a test operation, the integrated circuit having an activatable bridging circuit, wherein the bridging circuit is connected in parallel with a first circuit component of the integrated circuit; and
   operating the integrated circuit in the test operation for measuring the electrical properties of one of the circuit components of the integrated circuit;
   wherein;
   in normal operation of the integrated circuit, an external terminal is connected to the first circuit component via a second circuit component and the bridging circuit is deactivated, and
   in test operation of the integrated circuit, a test mode signal is applied to the bridging circuit, and the bridging circuit is activated and operated in a conducting state such that the external terminal is connected to the first circuit component via the bridging circuit with a lower impedance than via the second circuit component; and
   wherein a short-circuit current is fed into the integrated circuit by applying an input voltage having an AC component to the external terminal.

8. The method as claimed in claim 7, wherein, by applying an input pulse of the input voltage to the external terminal, a wave running into the integrated circuit is generated and a reflected wave is subsequently detected at the external terminal.

9. The method as claimed in claim 8, wherein in the test state, by selection of different test modes, switches are activated and, as a result,
   one device or a plurality of devices of a memory cell array are connected serially or in parallel,
   one or a plurality of memory cell arrays are connected serially or in parallel,
   one or a plurality of lines and switches are connected to an external terminal.

10. The method as claimed in claim 8, wherein, depending on the test mode chosen, the length of the line from the external terminal into the interior of the integrated circuit is varied in order to include different numbers of circuit components in the measurement.

11. The method as claimed in claim 7, wherein the electrical properties of the circuit components of an integrated circuit are measured by measuring the S parameters.

* * * * *